US012627274B2

(12) United States Patent
Chatterjee

(10) Patent No.: US 12,627,274 B2
(45) Date of Patent: May 12, 2026

(54) METHODS, SYSTEMS, AND APPARATUS FOR COUPLING POWER AMPLIFIER INPUT SIGNALS

(71) Applicant: Texas Instruments Incorporated, Dallas, TX (US)

(72) Inventor: Rohit Chatterjee, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 464 days.

(21) Appl. No.: 18/234,651

(22) Filed: Aug. 16, 2023

(65) Prior Publication Data

US 2025/0062733 A1 Feb. 20, 2025

(51) Int. Cl.
| | |
|---|---|
| *H03F 3/45* | (2006.01) |
| *H03F 3/195* | (2006.01) |
| *H03F 3/24* | (2006.01) |
| *H03F 3/68* | (2006.01) |
| *H03F 3/72* | (2006.01) |

(52) U.S. Cl.
CPC .............. *H03F 3/68* (2013.01); *H03F 3/195* (2013.01); *H03F 3/245* (2013.01); *H03F 3/45183* (2013.01); *H03F 3/72* (2013.01); *H03F 2200/451* (2013.01)

(58) Field of Classification Search
CPC ........................................................ H03F 3/45
USPC .......................................... 330/252, 260, 69
See application file for complete search history.

(56) References Cited

U.S. PATENT DOCUMENTS

| | | | |
|---|---|---|---|
| 11,303,248 B2 | 4/2022 | Sahu et al. | |
| 2005/0184805 A1 | 8/2005 | Murakami | |
| 2018/0069513 A1 | 3/2018 | Kumar | |

FOREIGN PATENT DOCUMENTS

| | | |
|---|---|---|
| CN | 113109619 A | 7/2021 |
| CN | 109067371 B | 11/2021 |
| CN | 110198156 B | 1/2022 |
| WO | 2015088857 A1 | 6/2015 |

*Primary Examiner* — Henry Choe
(74) *Attorney, Agent, or Firm* — Michelle F. Murray; Frank D. Cimino

(57) ABSTRACT

Methods, systems, and apparatus are disclosed for coupling a power amplifier input signal. An example system a first amplifier including a signal input, a feedback input, and a differential output that includes a first output and a second output, a first resistor including a first resistor terminal and a second resistor terminal, wherein the first resistor terminal is coupled to the first output, a second resistor including a third resistor terminal and a fourth resistor terminal, wherein the third resistor terminal is coupled to the second resistor terminal at an output common mode node and the fourth resistor terminal coupled to the second output, and a second amplifier including a first input and a third output, wherein the first input is coupled to the second resistor terminal and third resistor terminal, and the third output is coupled to the feedback input of the first amplifier.

20 Claims, 5 Drawing Sheets

METHODS, SYSTEMS, AND APPARATUS FOR COUPLING POWER AMPLIFIER INPUT SIGNALS

FIELD OF THE DISCLOSURE

This disclosure relates generally to power amplifier input signals and, more particularly, to methods, systems, and apparatus for coupling power amplifier input signals.

BACKGROUND

Some electronic devices include one or more transceivers to communicate with other devices using radio frequency (RF) signals. Such transceivers include RF power amplifiers to convert low-power RF signals to higher power signals. The higher power signals drive an antenna of the transceiver to transmit data, included in the low-power RF signal to other devices. Some power amplifiers are coupled to other stages of a transceiver, such as an input stage and an output stage.

Figure 1:
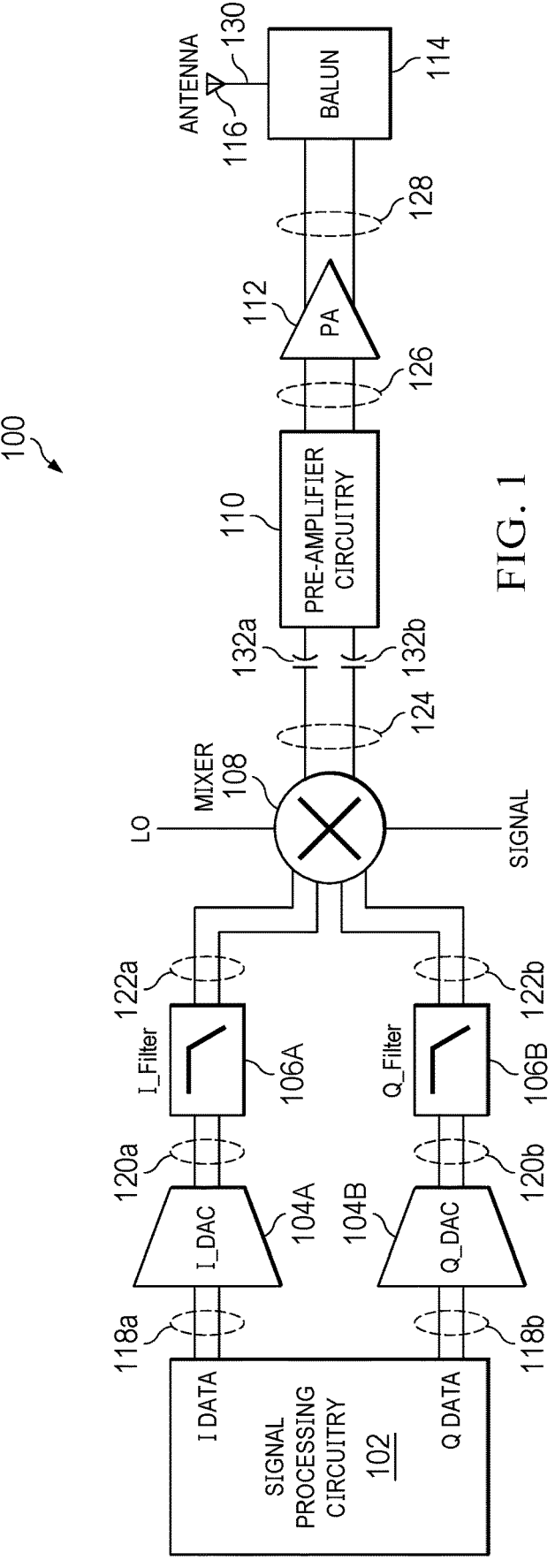
FIG. 1 is a block diagram of an example transmitter to transmit an information signal.

In general, the same reference numbers will be used throughout the drawing(s) and accompanying written description to refer to the same or like parts. The figures are not necessarily to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly within the context of the discussion (e.g., within a claim) in which the elements might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real world imperfections as will be understood by persons of ordinary skill in the art. For example, "approximately" and "about" may indicate such dimensions may be within a tolerance range of +/−10% unless otherwise specified in the below description.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein integrated circuit/circuitry is defined as one or more semiconductor packages containing one or more circuit elements such as transistors, capacitors, inductors, resistors, current paths, diodes, etc. For example an integrated circuit may be implemented as one or more of an ASIC, an FPGA, a chip, a microchip, programmable circuitry, a semiconductor substrate coupling multiple circuit elements, a system on chip (SoC), etc.

DETAILED DESCRIPTION

The demand for smaller, lighter, and more portable electronic devices such as smartphones, laptops, wearables, and IoT (Internet of Things) devices is on the rise. Reduced die sizes enable manufacturers to pack more functionality into compact form factors on an integrated circuit (IC), making it easier for consumers to carry and use these devices. Additionally, smaller die sizes contribute to cost reduction on the manufacturing side and improved energy efficiency on the consumer side. An example die, in the context of integrated circuits, is a small block of semiconducting material on which a given functional circuit is fabricated.

Transmitters are one of many types of integrated circuits (ICs) that are used in communication devices (e.g., smartphones, laptops, IoT devices, etc.). Transmitters communicate data from one device to another. In some examples, transmitters include a plurality of stages to perform various functions for efficient and accurate transmission. As used herein, a stage can be referred to as a "device" and/or a "module." For example, the power amplifier in a transmitter can be referred to as a stage, a device, a module, etc., of the transmitter. In some examples, a challenge occurs when transmitting a signal from one stage to the next.

Different techniques exist to couple one device (e.g., a power amplifier) to another device (e.g., an input stage or an output stage). A type of coupling technique may be selected based on the application of the transceiver. An example transmitter operating in a relatively higher frequency range (e.g., GHz range such as 2.4 GHz, 5-7 GHz, and 77-81 GHz) utilizes on-chip transformers and/or inductors to couple a radio frequency (RF) signal between different stages. For example, transformers provide impedance matching between a source stage (e.g., a power amplifier) and a receiving stage (e.g., an antenna). As used herein, impedance matching is the process of adjusting the impedance of a source and load to ensure efficient transfer of power and minimize signal reflections. Impedance is a measure of the opposition to the flow of alternating current (AC) in a circuit. For example, impedance may be represented by a sum of the total resistance of a circuit (R) and the total reactance of the circuit (X) (e.g., Z=R+jX, where "j" denotes that the reactance "X" is an imaginary part of the impedance, Z). When resistance and/or reactance increase, so does the impedance. Both resistance and reactance are typically measured in ohms. Circuits can have inductive reactance ($X_L$) and/or capacitive reactance ($X_c$). Both inductive reactance and capacitive reactance are measured based on frequency (f). For example, inductive reactance increases as frequency increases (e.g., $X_L=2\pi fL$, where L is inductance in Henries) and capacitive reactance increases as frequency decreases (e.g., $X_C=\frac{1}{2}\pi fC$, where C is capacitance in farads). According to a maximum power transfer theorem, the maximum power is transferred from a source (e.g., a source stage) to a load (e.g., a receiving stage) when the source and load impedances are complex conjugate of each other. Impedance matching ensures that the load receives the maximum available power from the source.

Transformers and/or inductors can provide signal attenuation, amplification, and/or filtering to match the requirements of the receiving stage. Additionally, transformers can provide DC blockage. For DC blockage, a transformer only couples AC signals from the transformer primary to the transformer secondary and, therefore, blocks the DC component of an RF signal and allows the AC component of the RF signal to pass from the source stage to receiving stage. DC blockage may be used when coupling RF signals between stages because the DC bias or offset voltage from one stage can interfere with the operation of the other stage. Additionally, inductors are used in conjunction with capacitors to provide DC blockage. While the inductors and/or transformers provide benefits to coupling an RF signal from a source stage to a receiving stage, they also occupy a greater portion of the total transmitter area (e.g., 30-40% of the total transmitter area).

A transmitter operating in a lower frequency range (e.g., less than the GHz range such as 170 MHz-950 MHz) may implement coupling capacitors as opposed to inductors to couple a radio frequency (RF) signal between different stages, such as a pre-power amplifier (PPA) and a power amplifier (PA). Lower frequency transmitters may be less likely to use on-chip transformers or inductors for coupling the RF signal because such transformers or inductors would be large at lower frequencies. For example, the lower the frequency, the larger the size of the inductor because the reactance of an inductor ($X_L$) is directly proportional to the frequency (e.g., $X_L=2\pi Lf$). Therefore, a tradeoff exists for lower frequency transmitters: area size versus impedance matching with inductors. For example, in order to maintain a reasonable impedance (Z) at a lower frequency, the inductor may be significantly larger than the inductor of a transmitter operating at a higher frequency. Therefore, lower frequency transmitters may utilize capacitors to couple RF signals between stages (e.g., between a PPA and a PA) as an impedance matching tradeoff for reduced area size, because the large transformers and/or inductors may pose design problems and take up too much area in a transmitter.

In some examples, capacitors can be utilized in lower frequency transmitters because capacitive reactance ($X_C$) is inversely proportional to frequency. For example, capacitors can be used between a PPA and a PA to couple the output signal from the PPA to the input of the PA Capacitors can be used because a capacitor can be smaller than inductors while still providing a reasonable impedance. For example, capacitive reactance ($X_C$) is measured as the reciprocal of $2\pi Cf$, where C is the value of the capacitor in farads. However, the coupling capacitors may still be large to efficiently couple the RF signal from the PPA to the PA. In some examples, the coupling capacitors are chosen such that they are larger (e.g., 8 to 10 times larger) than the input capacitance of the amplifier into which RF signal is being coupled (e.g., coupled to the PA).

In some examples, a problem that occurs with coupling capacitors involves biasing an input of a stage. For example, the input devices of the PA may be biased with a DC voltage. In some examples, the input devices of a PA are transistors. The gate terminals of the transistors need to be biased with a certain gate bias voltage to ensure intended operation. In some examples, the bias voltage can be drawn from the DC component ($V_{dc}$) of a PPA output signal. In some examples, specifically in higher frequency transmitters, the DC component can be provided through a center tap of a secondary coil of a transformer.

Alternatively, the bias voltage can be generated using a fixed biasing scheme or a dynamic biasing scheme. In fixed biasing schemes for lower frequency transmitters, the bias voltage is provided through a high value resistor coupled directly to the gate terminals of the input transistors and the RF signal is provided through coupling capacitors connected between the PPA output and the PA input. The resistor has to be a high value resistor because the output of the PPA (e.g., the communication signal, the RF signal, etc.) is a different path than a path through which the bias signal is provided (e.g., the output of a driver biasing circuit). For example, the impedance of the biasing resistors is parallel to the input impedance of the PA. Therefore, there is a possibility of a split signal current if the value of the biasing resistors is not high enough. For example, a portion of the communication signal will go into the PA and there is a possibility that another portion of the communication signal will go into the biasing resistors and back into the biasing circuitry. In some examples, the split signal current can be avoided if the input resistors provide an impedance that is high enough or higher than the input impedance of the PA. In some examples, a size of the biasing resistors can be determined based on the size of the coupling capacitors, the size of the capacitance of the gates of the input transistors, and the frequency at which the transmitter is operating.

A problem that occurs while using coupling capacitors is introduced when a dynamic biasing scheme is implemented in a lower frequency transmitter. In some examples, dynamic biasing schemes include tracking a signal level of the input to the PA (e.g., tracking an envelope of the PPA output signal) and generating a bias voltage that is a function of the signal amplitude. In some examples, the R-C based biasing (e.g., biasing resistors implemented in parallel to the coupling capacitors in lower frequency transmitters) makes it impractical to implement dynamic biasing due to the high values of the coupling capacitors and bias resistors.

For example, the high values of the coupling capacitors and bias resistors increase the R-C delay of the bias path, which causes memory effect and introduces non-idealities in the transmitter output, wherein the memory effect degrades transmitter error vector magnitude (EVM). As used herein, "memory effect" refers to the phenomenon where the transmitter's output signal is affected by its previous states or inputs. In some examples, the memory effect can arise due to various factors. These factors can introduce a time-dependent response in the transmitter, causing the output signal to be influenced by past inputs. For example, if you have large resistors in the dynamic biasing path and large coupling capacitors at the PA input, the bias voltage takes a longer time reacting to a change in the PPA output signal level. For example, if PPA output increases suddenly, ideally the dynamic biasing scheme outputs a bias voltage that faithfully tracks the increase in the PPA output signal envelope. However, the large resistance in the biasing path in conjunction with the large coupling capacitor increases a delay in tracking the increase in PPA output envelope and, thus, creates a lag causing memory effect. The value of the resistance cannot decrease, however, because without a high resistance value, there will be a split current signal causing a reduction of PPA voltage gain, necessitating a higher current consumption in the PPA to recover the lost gain.

Examples disclosed herein reduce and/or eliminate the memory effect problem and reduce the amount of semiconductor die area required when implementing dynamic bias.

FIG. 1 is a block diagram of an example transmitter 100 to transmit an information signal. The example transmitter 100 includes example signal processing circuitry 102, example digital-to-analog converters (DACs) 104A, 104B, example filters 106A, 106B, an example mixer 108, example pre-amplifier circuitry 110, an example power amplifier (PA) 112, an example balun 114, and an example antenna 116.

In FIG. 1, the example signal processing circuitry 102 includes first connections 118a, 118b. The example DACs 104A, 104B include second connections 120a, 120b. The example filters 106A, 106B include third connections 122a, 122b. The example mixer 108 includes a fourth connection 124. The example pre-amplifier circuitry 110 includes a fifth connection 126. The example PA 112 includes a sixth connection 128. The example balun 114 includes a seventh connection 130. In some examples, the connections (e.g., the first connections 118a, 118b, the second connections 120a, 120b, the third connections 122a, 122b, the fourth connection 124, the fifth connection 126, the sixth connection 128, and the seventh connection 130) represent communication channels, such as wires, copper traces, cables, etc. The example connections 118a, 118b, 120a, 120b, 122a, 122b, 124, 126, 128, 130 may be any type of channel that can communicate data (e.g., analog signals, digital signals, waveforms, etc.) from one stage to another stage.

The example signal processing circuitry 102 is coupled to the example DACs 104A, 104B via the example first connections 118a, 118b. In this example, the first connections 118a, 118b are representative of the outputs of the signal processing circuitry 102, where first connection 118a and first connection 118b provide differential outputs. The example DACs 104A, 104B are coupled to the example filters 106A, 106B via the example second connections 120a, 120b, respectively. In this example, the second connections 120a, 120b are representative of the outputs of the DACs 104A, 104B, where second connection 120a and second connection 120b provide differential outputs. The example filters 106A, 106B are coupled the example mixer 108 via the example third connections 122a, 122b. In this example, the third connections 122a, 122b are representative of the outputs of the filters 106A, 106B, where third connection 122a and third connection 122b provide differential outputs. The example mixer 108 is coupled to the example pre-amplifier circuitry 110 via the example fourth connection 124. The example fourth connection 124 provides a differential output. The example pre-amplifier circuitry 110 is coupled to the example PA 112 via the example fifth connection 126. The example fifth connection 126 provides a differential output. The example PA 112 is coupled to the example balun 114 via the example sixth connection 128.

The example sixth connection 128 provides a differential output. The example balun 114 is coupled to the example antenna 116 via the seventh connection 130.

In FIG. 1, the example signal processing circuitry 102 is hardware that processes digital signals. In some examples, the signal processing circuitry 102 is a baseband processor and/or a modem. For example, the signal processing circuitry 102 converts digital data into analog signals suitable for transmission over a communication channel. In some examples, the signal processing circuitry 102 obtains the digital information from programmable circuitry (e.g., Central Processor Unit (CPU), a microprocessor, a Field Programmable Gate Array (FPGA), an Application Specific Integrated Circuit (ASIC), etc.), which could be in the form of binary bits, and prepares it for modulation. For example, the signal processing circuitry 102 generates in-phase (I) data and quadrature (Q) data from the digital information. In some examples, the I data is a data signal representative of an in-phase sinusoidal signal and Q data is a data signal representative of a quadrature sinusoidal signal, where the in-phase sinusoidal signal and the quadrature sinusoidal signal have the same frequency and are 90 degrees out of phase with respect to each other. In some examples, the I data is binary bits represented by a modulated cosine waveform and the Q data is binary bits represented by a modulated sine waveform (e.g., where the sine wave is shifted by 90 degrees relative to the cosine wave). Of course, any signal processing circuitry could be utilized and any modulation scheme could be utilized. In this example, the I data is provided to a first DAC 104A via a first one of the first connections 118a and the Q data is provided to the second DAC 104B via a second one of the first connections 118b.

In FIG. 1, the example DACs 104A, 104B convert the output of the signal processing circuitry 102 (e.g., I data and the Q data) into an analog signal. For example, the DACs 104A, 104B convert the digital data, which is in discrete binary form consisting of 0s and 1s, into a continuous analog waveform. In some examples, the first DAC 104A converts the I data into an analog signal and the second DAC 104B converts the Q data into an analog signal. The example DACs 104A, 104B convert the output of the signal processing circuitry 102 in order to transmit information included in the output of the signal processing circuitry 102. In some examples, the DACs 104A, 104B generate the modulating signal that is to be mixed by the example mixer 108.

In FIG. 1, the example filters 106A, 106B obtain the output of the example DACs 104A, 104B, via the example second connections 120a, 120b, to filter out unwanted frequencies. For example, the outputs of the DACs 104A, 104B at the second connections 120a, 120b are continuous analog waveforms that contain not only the original data from the digital information, but also additional frequencies introduced during the digital-to-analog conversion. Therefore, the example filters 106A, 106B eliminate noise and extraneous components from the transmitted signal. In some examples, a first filter 106A obtains the output of the first DAC 104A via a first one of the second connections 120a and the second filter 106B obtains the output of the second DAC 104B via the a second one of the second connections 120b. The band-pass filters may have any suitable frequency profile, and in some examples, the filters 106A, 106B are band-pass filters. Additionally and/or alternatively, the example filters 106A, 106B are any type of analog signal filter.

In FIG. 1, the example mixer 108 mixes the output of the example filters 106A, 106B with a carrier signal to convert the modulated signals (e.g., the filtered analog signals) to a higher frequency that can be transmitted. Such a conversion is referred to as "upconversion." Although only one stage of frequency upconversion is illustrated, there may be multiple stages of frequency upconversion utilized by the example transmitter 100. In some examples, the carrier signal is a local oscillator (LO) signal that has a high-frequency capable of travelling long distances with minimal interference. In some examples, the mixer 108 combines the carrier signal (e.g., the LO signal) with the filtered analog signals, resulting in output signals. For example, the mixer 108 combines the carrier signal with the output of the first filter 106A and the output of the second filter 106B to generate output signals (e.g., differential output signals). The example mixer 108 may be implemented by any type of mixing circuitry. The modulated signal may utilize any type of modulation technique (e.g., amplitude modulation, frequency modulation, phase modulation) depending on an application of the example transmitter 100. In this example, the differential output signals are provided to the pre-amplifier circuitry 110 via the fourth connection 124.

In FIG. 1, the example pre-amplifier circuitry 110 prepares the output signals to be amplified by the example PA 112. For example, as described in detail in connection with FIG. 2, the pre-amplifier circuitry 110 generates first amplification signals that are amplified enough to be noise-tolerant and ascertainable by the PA 112. The example pre-amplifier circuitry 110 obtains the output signals, via the fourth connection 124 and first and second coupling capacitors 132a, 132b. In some examples, the first coupling capacitor 132a and the second coupling capacitor 132b couple the output signals from the mixer 108 to the pre-amplifier circuitry 110. In some examples, the first and second coupling capacitors 132a, 132b prevent the output signals from interfering with bias voltage applied to the input devices to the pre-amplifier circuitry 110 by blocking any DC components in the output signals. The example first amplification signals are provided to the example PA 112 for further processing. In this example, the first amplified signals are provided to the PA 112 via the fifth connection 126. An example of the pre-amplifier circuitry 110 is described in further detail below in connection with FIG. 2.

In FIG. 1, the example PA 112 generates second amplification signals that include a power level (e.g., an amplitude) great enough to transmit the information. For example, the PA 112 increases the power level of the first amplification signals to the point where they meet the specification of the transmitter 100. In some examples, the second amplification signals drive the antenna 116. For example, the purpose of the transmitter 100 is to deliver a signal with required properties and specified power level to the antenna 116, and the PA 112 provides the amplification of that signal to the level expected at an antenna port (e.g., the balun 114). In this example, the second amplified signals are provided to the balun 114 via the sixth connection 128.

In FIG. 1, the example balun 114 matches an impedance of the antenna 116 to the channels (e.g., transmission lines) carrying the second amplification signals from the PA 112. In some examples, the balun 114 is a device used to convert a balanced (e.g., differential) AC signal (e.g., second amplification signals) into an unbalanced (e.g., single-ended) AC signal. By using the example balun 114, the balanced signal (e.g., second amplification signals) from the transmission line is converted to an unbalanced signal suitable for the antenna 116. This helps ensure efficient power transfer and minimizes signal loss due to impedance mismatches. Alternatively, the example balun 114 converts a balanced signal into an unbalanced signal. The output of the example balun

114 depends on a configuration of the example PA 112 and the example antenna 116. In this example, the output of the balun 114 is provided to the antenna 116 via the seventh connection 130.

In FIG. 1, the example antenna 116 is to obtain the second amplification signals and transmit them as a wireless RF signal. The example antenna 116 is coupled to the output of the example balun 114 via the seventh connection 130 and obtains an unbalanced (or single-ended) version of the second amplification signals. In some examples, the antenna 116 is implemented by any type of antenna suitable for transmitting RF signals.

Figure 2:
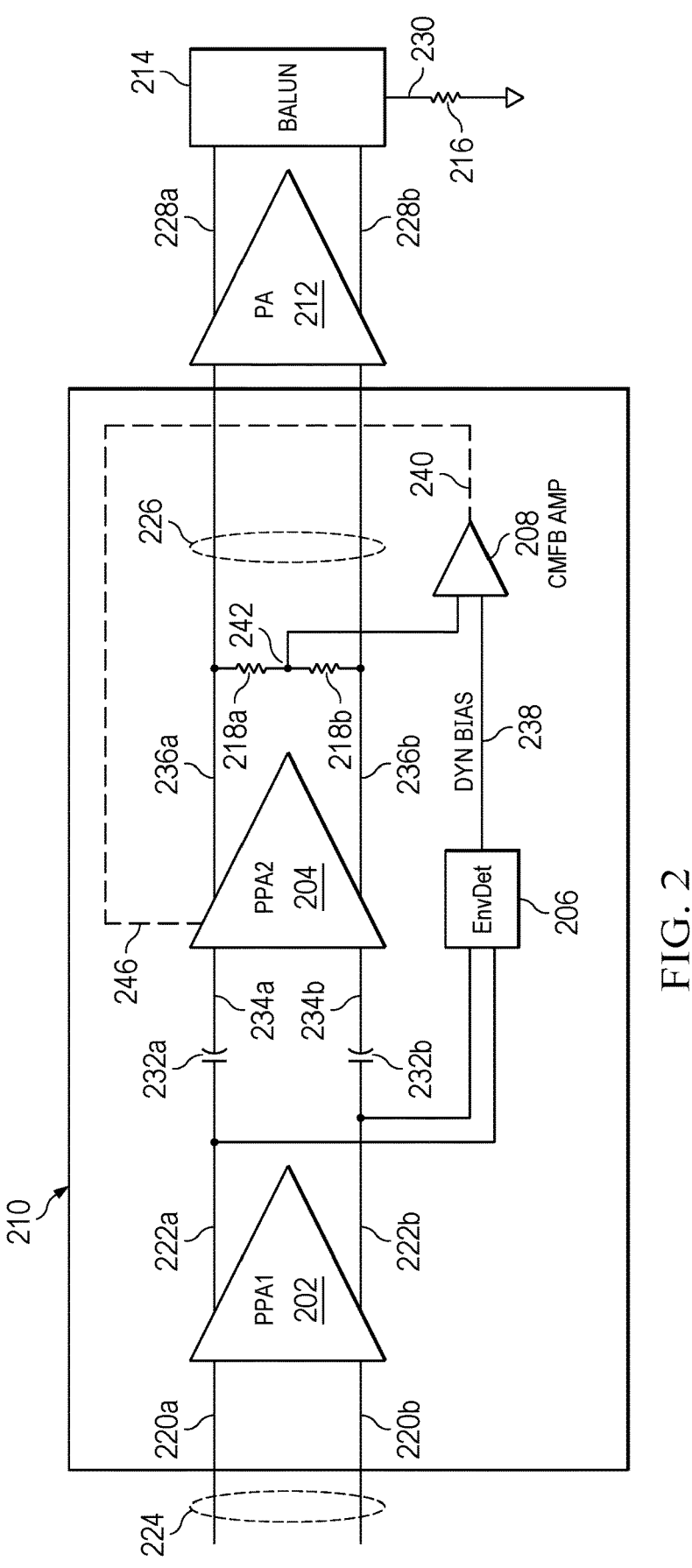
FIG. 2 is a schematic illustration of example pre-amplifier circuitry of FIG. 1 including a common path for modulated signals and bias voltage.

FIG. 2 is a schematic illustration of example pre-amplifier circuitry 210 to implement the pre-amplifier circuitry 110 of FIG. 1. The example pre-amplifier circuitry 210 includes an example first pre-power amplifier (PPA) 202, an example second PPA 204, example envelope detection circuitry 206, example common-mode feedback (CMFB) amplifier 208, and example averaging resistors 218a, 218b. The example illustration in FIG. 2 includes an example PA 212, an example balun 214, and an example antenna 216 to depict the connections 226, 228, and 230 within the schematic illustration of the example pre-amplifier circuitry 210.

In FIG. 2, the example first PPA 202 includes a first PPA input 220a and a second PPA input 220b configured to receive the output signals (e.g., upconverted modulated signals) from the mixer (not shown). For example, the first PPA input 220a and the second PPA input 220b of the first PPA 202 are coupled to the outputs of the mixer 108 of FIG. 1 via the example fourth connection 224 and the example coupling capacitors 132a, 132b. The example first PPA 202 is to provide first amplified signals to both the example second PPA 204 and the example envelope detection circuitry 206. For example, a first signal path, coupling the first PPA 202 to the second PPA 204, and the envelope detection circuitry 206 are arranged electrically parallel with each other. The first signal path couples a first PPA output 222a and a second PPA output 222b to the example second PPA 204. In some examples, the first PPA 202 is to increase the gain of the output signals by a first amount in order to 1) prepare the output signals for amplification by the PA 112 and 2) provide a signal level that is high enough for the envelope detection circuitry 206 to sense (e.g., track, detect, identify, etc.) the envelope of the amplified output signals. In some examples, the signal at the first PPA output 222a has the same gain and frequency as the signal at the second PPA output 222b but is shifted 180 degrees out-of-phase relative to the signal at the second PPA output 222b. Additionally and/or alternatively, the signal at the first PPA output 222a is shifted by any amount of degrees out-of-phase relative to the signal at the second PPA output 222b.

In FIG. 2, the example second PPA 204 includes a third PPA input 234a and a fourth PPA input 234b. The third PPA input 234a is coupled to the example first PPA output 222a via an example first coupling capacitor 232a. The fourth PPA input 234b is coupled to the example second PPA output 222b via an example second coupling capacitor 232b. The example second PPA 204 includes a third PPA output 236a and a fourth PPA output 236b. The example third and fourth PPA outputs 236a, 236b are coupled to the third connection 226.

In this example, the second PPA 204 is to provide a second gain to the first amplified output signals at the third and fourth PPA inputs 234a, 234b and output second amplified signals at the third and fourth PPA outputs 236a, 236b. For example, the second PPA 204 is to increase the gain of the first amplified signals by a second amount in order to prepare the output signals for amplification by the PA 112. In this example, the second PPA 204 increases the gain of the signals on the first PPA output 222a and the second PPA output 222b.

In FIG. 1, the example second PPA 204 is to output a PA bias voltage on the same path (e.g., on the third connection 226) as the second amplified signals. In this example, the third PPA output 236a includes the second amplified signal and the PA bias voltage to bias input devices of the example PA 112. In this example, the fourth PPA output 236b includes the second amplified signal and the PA bias voltage to bias the input device of the PA 112. In some examples, the bias voltage is generated based on the envelope detection circuitry 206, the CMFB amplifier 208, and the averaging resistors 218a, 218b.

For example, in FIG. 2, the pre-amplifier circuitry 110 includes the envelope detection circuitry 206 to track an envelope of an output of the first PPA 202. Examples of the envelope detection circuitry 206 are described in U.S. Pat. No. 11,303,248, which is hereby incorporated by reference in its entirety. The example envelope detection circuitry 206 includes a first envelope input and a second envelope input, where the first envelope input is coupled to the first PPA output 222a and the second envelope input is coupled to the second PPA output 222b. In some examples, the envelope detection circuitry 206 senses (e.g., tracks, monitors, identifies, captures, etc.) the output of the first PPA 202 based on the signals at the first PPA output 222a and the second PPA output 222b. The example envelope detection circuitry 206 generates a rectified bias voltage of the sensed output. For example, the envelope detection circuitry 206 monitors a level of the first amplified signal (e.g., the signals at the first and second PPA outputs 222a, 222b) and outputs a full-wave rectified signal whose average tracks a strength or voltage swing level of the first amplified signal. In other words, the example envelope detection circuitry 206 takes a high-frequency signal as an input and produces an output which is the full-wave rectified version with its average level tracking the envelope of the high-frequency input signal. In some examples, the envelope detection circuitry 206 then adds a fixed bias to the full-wave rectified signal. For example, if the sensed output of the first PPA 202 is low, the fixed bias voltage ensures that the output of the envelope detection circuitry 206 is at a level great enough to drive an input to the CMFB amplifier 208. Lastly, the envelope detection circuitry 206 generates a dynamic bias voltage at an eighth connection 238. The example envelope detection circuitry 206 is coupled to the CMFB amplifier 208 via the eighth connection. In some examples, the dynamic bias voltage is provided as one input of the CMFB amplifier 208. The example envelope detection circuitry 206 is described in further detail below in connection with FIG. 4.

In FIG. 2, the example CMFB amplifier 208 includes a first amplifier input, a second amplifier input, and a feedback output 240. The first amplifier input is coupled to the example envelope detection circuitry 206 via the eighth connection 238 to obtain the dynamic bias voltage. The second amplifier input is coupled to an output common mode node 242 of the example averaging resistors 218a, 218b. The feedback output 240 is coupled to a fifth PPA input 246 of the second PPA 204 to feedback a correction signal to the second PPA 204. In some examples, the feedback output 240 is a feedback input to the second PPA 204.

In FIG. 2, the example averaging resistors 218a, 218b include a first averaging resistor 218a having a first resistor terminal and a second resistor terminal and a second averaging resistor 218b having a third resistor terminal and a fourth resistor terminal. The first resistor terminal of the first averaging resistor 218a is coupled to the third PPA output 236a and the second resistor terminal of the first averaging resistor 218a is coupled to the third resistor terminal of the second averaging resistor 218b at the output common mode node 242. The fourth resistor terminal of the second averaging resistor 218b is coupled to the fourth PPA output 236b. In this example, the first and second averaging resistors 218a, 218b provide an average amplitude of the second amplified signals. For example, the output common mode node 242 connecting the second resistor terminal of the first averaging resistor 218a to the third resistor terminal of the second averaging resistor 218b is an output common mode of the second PPA 204.

In an example first operation of the example pre-amplifier circuitry 110, the example first PPA 202 obtains first output signals from a mixer (e.g., the mixer 108 of FIG. 1). The example first PPA 202 amplifies the first output signals by a first amount. The example envelope detection circuitry 206 obtains the first amplified signals at the first PPA output 222a and the second PPA output 222b. The example envelope detection circuitry 206 rectifies the output of the example first PPA 202 and generates a dynamic bias voltage. In some examples, the dynamic bias voltage is an instantaneous bias voltage whose value depends on the amplitude of the signals at the first PPA 202 outputs 222a, 222b. In some examples, an instantaneous bias voltage is a dynamic bias voltage that instantly (e.g., approximately real time) tracks the change in amplitude of the signals at the first PPA 202 output 222a. In some examples, the input devices of the PA 212 are biased at this dynamic bias voltage.

In the example first operation of the pre-amplifier circuitry 110, the dynamic bias voltage is provided to the first amplifier input of the CMFB amplifier 208 via the eighth connection 238. The example CMFB amplifier 208 ensures that the example common mode node 242 of the example second PPA 204 is set equal to the example dynamic bias voltage. For example, CMFB amplifier 208 compares the dynamic bias voltage to the output common mode voltage of second PPA 204. The example CMFB amplifier 208 feeds back a correction signal on the feedback output 240 into the fifth PPA input 246. The correction signal on the feedback output 240 changes until the two amplifier inputs of the CMFB amplifier 208 are equal. For example, the correction signal on the feedback output 240 is applied to gate terminals of two PMOS transistors which operate to increase or decrease the bias voltage at the third and fourth PPA outputs 236a, 236b. An example operation of the two PMOS transistors is described in further detail below in connection with FIG. 3. In some examples, output common mode refers to an average of two sinusoid signals (e.g., second amplified signals at the third PPA output 236a and fourth PPA output 236b). Therefore, the bias voltage of the PA 212 is adjusted based on the correction signal. The example third PPA output 236a and the example fourth PPA output 236b carry both that adjusted bias voltage and the actual modulated signal. For example, the actual modulated signal (e.g., the second amplified signals) is "on top of" the bias voltage. As used herein, "on top of" means that AC signal is combined with (e.g., superimposed, added to, modulated with, mixed with, etc.) the DC signal and the resulting waveform carries both the characteristics of the DC signal and the variations imposed by the AC signal.

In an example second operation of the example pre-amplifier circuitry 110, the example first PPA 202 obtains second output signals from a mixer (e.g., the mixer 108 of FIG. 1). In this example, the second output signals have a higher gain than the first output signals in the example first operation. Therefore, the output of the example first PPA 202 increases relative to the output during the example first operation. The example envelope detection circuitry 206 rectifies the output of the example first PPA 202 and generates a dynamic bias voltage that has increased in value due to the increase in amplitude of the second modulated signals.

In the example second operation of the pre-amplifier circuitry 110, the increased dynamic bias voltage is provided to the first amplifier input of the CMFB amplifier 208 via the eighth connection 238. The example CMFB amplifier 208 compares the dynamic bias voltage to the output common mode voltage of second PPA 204. In some examples, the output common mode voltage of the second PPA 204 may initially be less than the dynamic bias voltage. The example CMFB amplifier 208 feeds back a correction signal into the example second PPA 204 that causes the second PPA 204 to increase the output common mode. The correction signal on the feedback output 240 changes until the two amplifier inputs of the CMFB amplifier 208 are equal. Therefore, the bias voltage of the PA 212 is adjusted based on the correction signal and faithfully tracks the signals at the output of the first PPA 202.

In this example, a dynamic bias loop provided by the CMFB amplifier 208 is fast enough to ensure that memory effect does not corrupt an output of the transmitter (e.g., transmitter 100 of FIG. 1). For example, the correction signal provided by the CMFB amplifier 208 changes at a speed fast to ensure the PA bias voltage faithfully tracks the output of the first PPA 202. Additionally, having the PA bias voltage on the same signal path as the actual signal reduces power amplifier area on a die. For example, combining the bias voltage signal path and the actual signal path on the third PPA output 236a and the fourth PPA output 236b eliminates the need for coupling capacitors between the PPA (e.g., the second PPA 204) and the PA 212.

Figure 3:
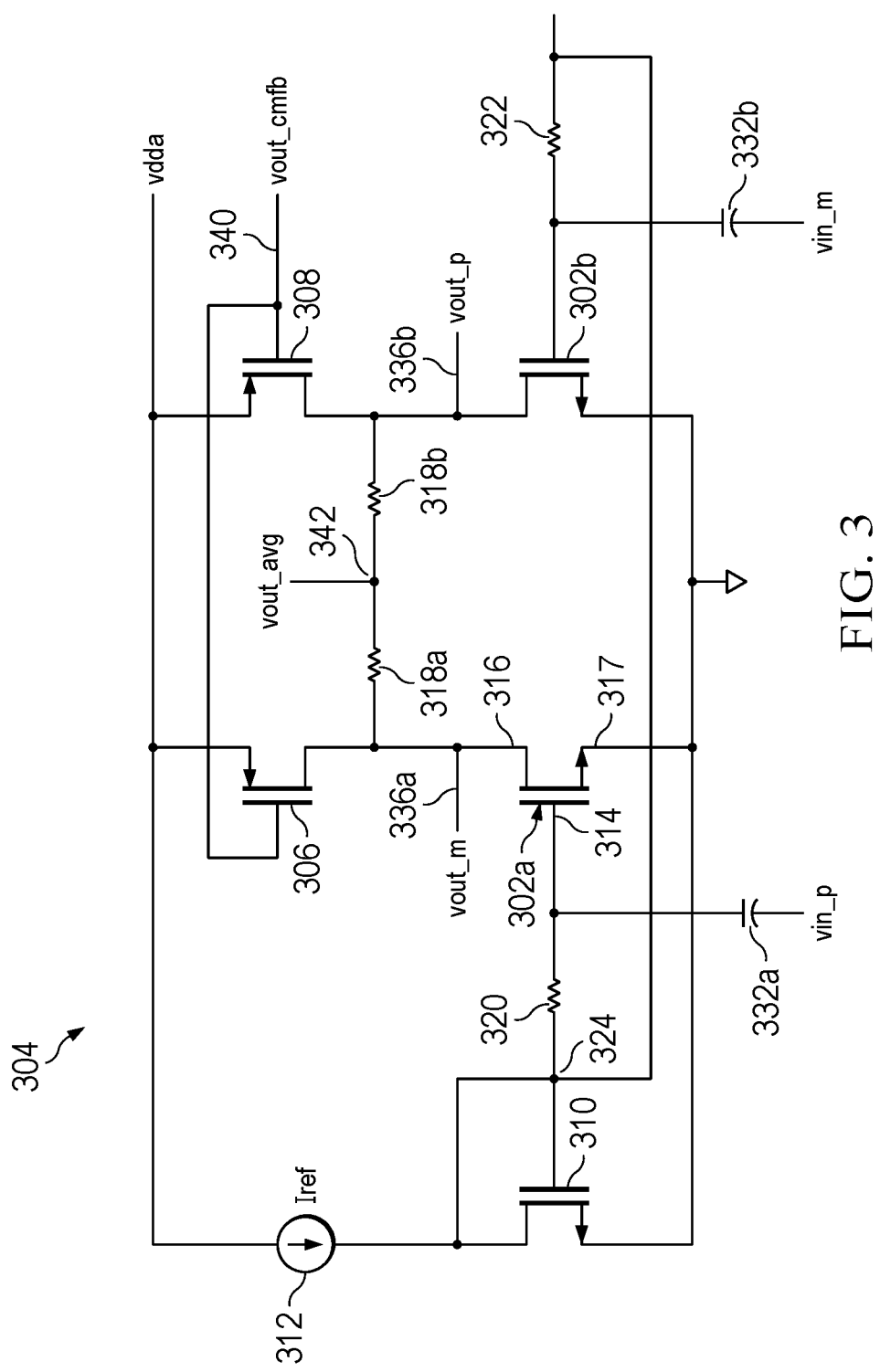
FIG. 3 is a schematic illustration of an example second pre-power amplifier of the pre-amplifier circuitry of FIG. 2.

FIG. 3 is a schematic illustration of the example second PPA 304. The example second PPA 304 can implement the example second PPA 204 of FIG. 2. The example second PPA 204 includes an example first transistor 302a, an example second transistor 302b, an example third transistor 306, an example fourth transistor 308, an example fifth transistor 310, an example current source 312, the example first averaging resistor 318a, the example second averaging resistor 318b, the example first coupling capacitor 332a, and the example second coupling capacitor 332b.

In FIG. 3, the example first transistor 302a, the example second transistor 302b, and the example fifth transistor 310 represent structures and characteristics of n-channel metal-oxide semiconductor (NMOS) transistors that may be used to implement the second PPA 304, the first PPA 202, the PA 112/212, and/or any type of amplifier. While the following description references only the first transistor 302a, the description applies to each of the example first transistor 302a, the example second transistor 302b, the example fifth transistor 310, and/or any other NMOS transistor. The example first transistor 302a includes a gate terminal 314, a drain terminal 316, and a source terminal 317. In some examples, the gate terminal 314 is a control terminal. In some examples, the drain terminal 316 and the source terminal 317 are current terminals. The example first transistor 302a operates at a particular threshold voltage ($V_{TH}$). The value of the $V_{TH}$ depends on intrinsic device properties of the transistor (e.g., doping concentration, channel length, oxide thickness, etc.) and the operating temperature. When a voltage level applied at the gate terminal 314 satisfies (e.g., is greater than) the $V_{TH}$ of the first transistor 302a (e.g., $V_{GS} > V_{TH}$), the first transistor 302a is referred to as being in an "on" state and creates a closed circuit between the drain terminal 316 and the source terminal 317 causing drain-to-source electrical current ($I_{ds}$) to flow between the drain terminal 316 and the source terminal 317 of the first transistor 302a (e.g., $I_{ds} = I_{ON}$). When the voltage level applied to the example gate terminal 314 does not satisfy (e.g., is less than) the $V_{TH}$ of the first transistor 302a (e.g., $V_{GS} < V_{TH}$), the first transistor 302a is referred to as being in an "off" state and creates an open circuit between the drain terminal 316 and the source terminal 317 causing drain-to-source electrical current ($I_{ds}$) to cease (e.g., $I_{ds} = I_{OFF}$).

In FIG. 3, the example third transistor 306 and the example fourth transistor 308 represent another type of transistor. For example, the third transistor 306 and the fourth transistor 308 represent structures and characteristics of p-channel metal-oxide semiconductor (PMOS) transistors that may be used to implement the second PPA 204/304, the first PPA 202, the PA 112/212, and/or any type of amplifier. In examples disclosed herein, PMOS transistors are represented with an arrow on the source terminal pointing towards the gate terminals, wherein NMOS transistors are represented with an arrow on the source terminal pointing away from the gate terminal. The "on" and "off" states of a PMOS transistor are activated based on opposite inputs at its gate terminal relative to the NMOS transistor. For example, when a voltage level applied at the gate terminal of a PMOS transistor relative to the supply voltage (VCC) satisfies (e.g., is greater than) the $V_{TH}$ of the PMOS transistor (e.g., $V_{GS} > V_{TH}$), the PMOS transistor is referred to as being in an "off" state, and when a voltage level applied at the gate terminal of the PMOS transistor relative to the supply voltage (VCC) does not satisfy (e.g., is less than) the $V_{TH}$ of the PMOS transistor (e.g., $V_{GS} < V_{TH}$), the PMOS transistor is referred to as being in an "on" state.

In FIG. 3, the example second transistor 302b includes a gate terminal, a drain terminal, and a source terminal. The example third transistor 306 includes a gate terminal, a drain terminal, and a source terminal. The example fourth transistor 308 includes a gate terminal, a drain terminal, and a source terminal. The example fifth transistor 310 includes a gate terminal, a drain terminal, and a source terminal. As described above, the example first averaging resistor 318a includes the first resistor terminal and the second resistor terminal, and the example second averaging resistor 318b includes the third resistor terminal and the fourth resistor terminal.

In FIG. 3, the gate terminal 314 is coupled to the first coupling capacitor 332a. The drain terminal 316 is coupled to the drain terminal of the example third transistor 306. The source terminal 317 is coupled to ground. The gate terminal of the example second transistor 302b is coupled to the second coupling capacitor 332b. The drain terminal of the example second transistor 302b is coupled to the drain terminal of the example fourth transistor 308. The source terminal of the example second transistor 302b is coupled to ground.

In FIG. 3, the gate terminal of the example third transistor 306 is coupled to the gate terminal of the example fourth transistor 308. The gate terminals of the example third and fourth transistors 306, 308 are coupled to the example feedback output 340 of the example CMFB amplifier 208 of FIG. 2. For example, the gate terminals of the example third and fourth transistors 306, 308 receive (e.g., obtain, are provided with, etc.) the correction signal from the CMFB amplifier 208. The source terminals of the example third and fourth transistors 306, 308 are coupled to a voltage supply rail (VDDA).

In FIG. 3, the example first transistor 302a and the example second transistor 302b are biased through the example fifth transistor 310, and the example fifth transistor 310 is biased at $I_{ref}$. In some examples, $I_{ref}$ is a current generated by the example current source 312. The example second PPA 304 of FIG. 3 includes an example third resistor 320 and an example fourth resistor 322. The example third resistor 320 includes a fifth resistor terminal and a sixth resistor terminal. The example fourth resistor 322 includes a seventh resistor terminal and an eighth resistor terminal.

In FIG. 3, the drain terminal of the example fifth transistor 310 is coupled to an output of the example current source 312. The gate terminal of the example fifth transistor 310 is tied to the drain terminal of the example fifth transistor 310 and to the output of the example current source 312. The gate terminal of the example fifth transistor 310 is coupled to the fifth resistor terminal of the example third resistor 320 at a bias node 324. The sixth resistor terminal of the example third resistor 320 is coupled to the gate terminal 314 of the example first transistor 302a. The seventh resistor terminal of the example fourth resistor 322 is coupled to the gate terminal of the example fifth transistor 310 at the bias node 324. The eighth resistor terminal of the example fourth resistor 322 is coupled to the gate terminal of the example second transistor 302b. In this manner, the example fifth transistor 310 biases the gate voltages of the example first transistor 302a and the second transistor 302b through the example third resistor 320 and the example fourth resistor 322. For example, the voltage $V_{ref}$ at the bias node 324 is applied to the gate terminals of the example first transistor 302a and the example second transistor 302b, where $V_{ref}$ is a level that satisfies (e.g., is greater than) the $V_{TH}$ of the first and second transistors 302a, 302b and causes the first and second transistors 302a, 302b to be in an "on" state.

In FIG. 3, the example first transistor 302a and the example second transistor 302b are referred to as the gain transistors. For example, the first transistor 302a and the second transistor 302b provide the second amount of gain to the input signals vin_p, vin_m (e.g., the first amplified signals at the first and second PPA outputs 222a, 222b). The example first transistor 302a outputs a first output signal (vout_m) that has increased in gain by a second amount. The example second transistor 302b outputs a second output signal (vout_p) that has increased in gain by the second amount. The example first and second transistors 302a, 302b invert the input signal (vin_p, vin_m, respectively) from gate to drain. In some examples, the output common mode (vout_avg) is obtained by averaging the first output signal (vout_m) and the second output signal (vout_p). For example, the averaging resistors 318a, 318b generate the output common mode of the first output signal (vout_m) and the second output signal (vout_p), where the output common mode is at output common mode node 342. The output common mode of the first output signal (vout_m) and the second output signal (vout_p) is provided to the second amplifier input of the example CMFB amplifier 208.

In FIG. 3, the example third transistor 306 and the example fourth transistor 308 ensure that the output nodes 336a and 336b are maintained at the required bias voltage. For example, the third transistor 306 and the fourth transistor 308 are biased by the correction signal at the feedback output 340 provided by the CMFB amplifier. By using this correction signal, the third transistor 306 and the fourth transistor 308 maintain the output nodes 336a and 336b at the required bias voltage. The CMFB amplifier controls the gate terminals of the example third transistor 306 and the example fourth transistor 308 via a dynamic correction signal. For example, the CMFB amplifier ensures that the output common mode (vout_avg) is set equal to the dynamic bias voltage by adjusting the value of the correction signal.

In an example operation, the example CMFB amplifier determines that the dynamic bias voltage increased. In this example, the CMFB amplifier outputs, at the feedback output 340, a reduced correction signal in order to ensure that the output common mode (vout_avg) also increases. In some examples, when the voltage at the gate terminals of the third transistor 306 and the fourth transistor 308 go low (e.g., reduces), the current at the drain terminals increases. In a different example operation, the example CMFB amplifier determines that the dynamic bias voltage decreased. In this example, the CMFB amplifier outputs, at the feedback output 340, an increased correction signal in order to ensure that the output common mode (vout_avg) also decreases. In some examples, when the voltage at the gate terminals of the third transistor 306 and the fourth transistor 308 go high (e.g., increase), the current at the drain terminals decreases.

In some examples, the values of the averaging resistors 318a, 318b are selected such that they are high enough to not reduce the gain of the second PPA 304, but low enough to not slow down the dynamic bias path. For example, if the resistance of the averaging resistors 318a, 318b are too low, a portion of the signal current created by the first and second transistors 302a, 302b, in response to the first amplified signals, will flow into the averaging resistors 318a and 318b, thereby reducing the voltage gain of the second PPA 304. In this scenario, the current consumption of the second PPA 304 will have to be increased in order to recover the lost gain. Alternatively, if the resistance of the averaging resistors 318a, 318b are too high, the averaging resistors 318a, 318b will cause the output common mode voltage (vout_avg) to take a longer time to track (e.g., equal) the dynamic bias voltage and, thus, cause memory effect. Therefore, the value of the averaging resistors 318a, 318b are selected such that neither memory effort nor increased current consumption occur.

Figure 4:
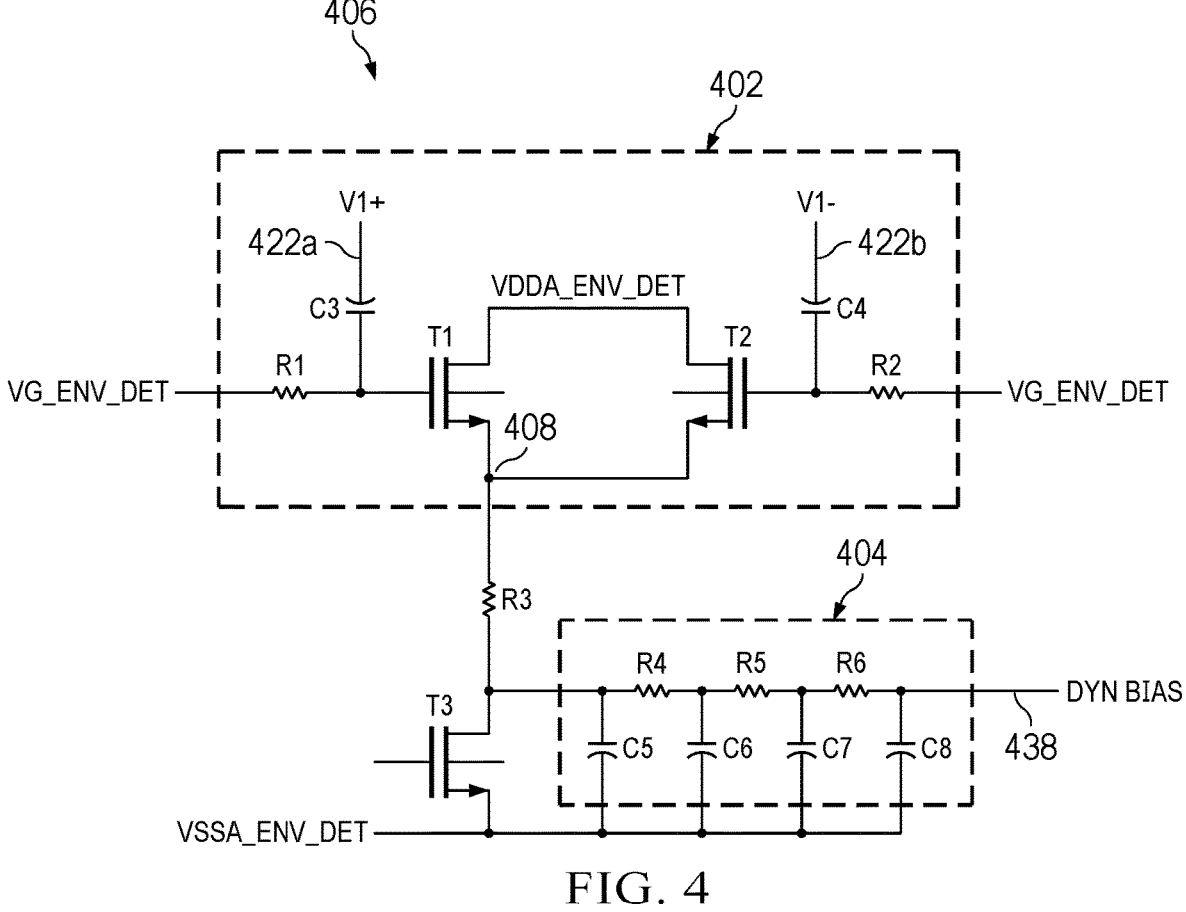
FIG. 4 is a schematic illustration of example envelope detection circuitry of FIG. 2 to track the envelope of an output of an example first pre-power amplifier of the pre-amplifier circuitry of FIG. 2 and generate a dynamic bias voltage based on the envelope.

FIG. 4 is a schematic illustration of the example envelope detection circuitry 406 to track the envelope of the first PPA outputs at the first and second PPA outputs 422a, 422b and generate a dynamic bias voltage at the eighth connection 438 based on the envelope. The example envelope detection circuitry 406 includes an example full-wave rectifier based level detector 402 and an example filter 404. The example full-wave rectifier base level detector 402 monitors a level of the first amplified signals on the first PPA outputs 422a, 422b and outputs a full-wave rectified signal whose average tracks a strength or voltage swing level of the first amplified signals on the first PPA outputs 422a, 422b. In an example, the full-wave rectifier base level detector 402 is an envelope detector that takes a high-frequency signal as an input and produces an output which is the full-wave rectified version with its average level tracking the envelope of the high-frequency input signal. The example filter 404 includes a capacitor that stores up charge on a rising edge of the high-frequency signal, and releases it slowly through a resistor when the high-frequency signal falls.

In FIG. 4, the example full-wave rectifier base level detector 402 includes first and second NMOS transistors T1 and T2 that are coupled to each other. The drains of the first and second NMOS transistors T1 and T2 are biased at suitable voltage level, VDDA_ENV_DET in the example envelope detection circuitry 406, and the sources of the first and second NMOS transistors T1 and T2 are coupled together and coupled to an input node of the example filter 404, via an example resistor R3. In some examples, the voltage level VDDA_ENV_DET is approximately 1.2 volts. A full-wave rectified node 408 is at a point in the example envelope detection circuitry 406 where the sources of the NMOS transistors T1 and T2 are coupled together. In some examples, this full-wave rectified node 408 sums the voltages from the rectified half-cycles from the sources of T1 and T2.

In FIG. 4, example resistors R1 and R2, and example capacitors C3 and C4, are coupled to the gates of the first and second NMOS transistors T1 and T2, respectively. The sides of the example capacitors C3 and C4, opposite the gates of the first and second NMOS transistors T1 and T2, are coupled to the outputs 422a, 422b of the example first PPA1 (e.g., first PPA 202 of FIG. 2) to receive the differential first amplified signals, demonstrated as V1+ and V1−. A gate voltage signal VG_ENV_DET is applied to the example resistors R1 and R2 opposite the side of the resistors R1 and R2 that are coupled to the gates of T1 and T2. In an example, the gate voltage signal VG_ENV_DET is a fixed DC bias signal (F_bias).

In FIG. 4, the example filter 404 provides a filtered level signal (e.g., dynamic bias voltage, DYN BIAS) at a node in the example envelope detection circuitry 406 where the example capacitor C8 and the example resistor R6 are coupled together. The example dynamic bias voltage is supplied to an input of the example CMFB amplifier, via the eighth connection 438, to dynamically bias the example PA (e.g., PA 112 of FIG. 1 and/or PA 212 of FIG. 2), as disclosed herein.

In FIG. 4, the example envelope detection circuitry 406 includes a third NMOS transistor T3. The side of the example resistor R3 opposite the full-wave rectified node 408 is coupled to T3. The drain of the NMOS transistorT3 is coupled to the example resistor R3 opposite a side of the example resistor R3 coupled to the full-wave rectified node 408. The example resistor R3 is a level-shifting resistor that controls a DC component of the dynamic bias signal, which adjusts small signal voltage gain of PA (e.g., PA 112 of FIG. 1 and/or PA 212 of FIG. 2). The source of T3 is coupled to a side of the example capacitors C5-C8 opposite a side coupled to the example resistors R4-R6. A control signal with defined voltage level is applied to the gate of T3 to control application of the dynamic bias signal to the side of the capacitors C5-C8 opposite a side coupled to the example resistors R4-R6 and thereby turn on (or off) the example envelope detection circuitry 406. As an example, the control voltage is generated by pumping a defined reference current into the drain terminal of another transistor device having its drain and gate electrically shorted together and its gate coupled to the gate of T3. Thus, the example NMOS transistors T3 can be selectively activated to turn on the dynamic bias or deactivated to turn off the dynamic bias.

In FIG. 4, the example filter 404 is a resistor-capacitor (R-C) filter circuit. The example filter 404 includes a plurality (e.g., four in this example) of capacitors C5-C8, with one end of each of the capacitors C5-C8 being coupled together. The purpose of the R-C filter is to remove high frequency components from the dynamic bias voltage, without adding any excess R-C delay which might lead to memory effect and degrade the EVM of the transmitted signal. The opposite end of the example capacitors C5-C7 is coupled to a neighboring capacitor via respective resistors R4-R6. Thus, the example resistors R4-R6 and example capacitors C5-C8 form an RC filter circuit adapted to implement a low pass filter transfer function. A voltage VSSA_ENV_DET (e.g., an electrical ground reference) is connected to the side of the example capacitors C5-C8 opposite that which is coupled to the example resistors R4-R6.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements, or actions may be implemented by, e.g., the same entity or object. Additionally, although individual features may be included in different examples or claims, these may possibly be combined, and the inclusion in different examples or claims does not imply that a combination of features is not feasible and/or advantageous.

Figure 5:
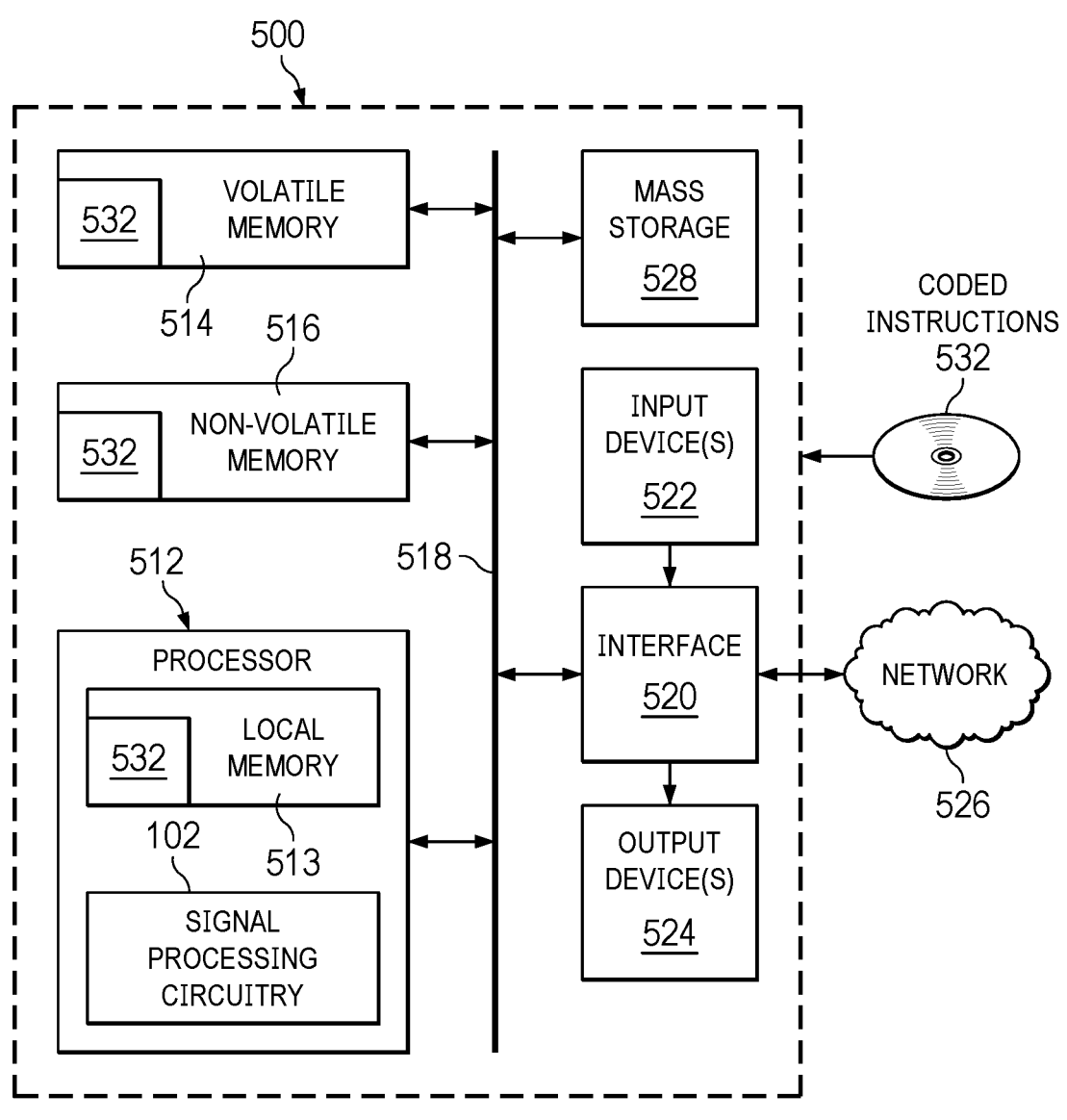
FIG. 5 is a block diagram of an example processing platform including programmable circuitry structured to implement the signal processing circuitry 102 of the transmitter of FIG. 1.

FIG. 5 is a block diagram of an example programmable circuitry platform 500 structured to implement portions and/or parts of the transmitter 100 of FIG. 1. The programmable circuitry platform 500 can be, for example, a server, a personal computer, a self-learning machine (e.g., a neural network), a mobile device (e.g., a cell phone, a smart phone, a tablet such as an iPad™), or any other type of computing and/or electronic device.

The programmable circuitry platform 500 of the illustrated example includes programmable circuitry 512. The programmable circuitry 512 of the illustrated example is hardware. For example, the programmable circuitry 512 can be implemented by one or more integrated circuits, logic circuits, FPGAs, microprocessors, CPUs, GPUs, DSPs, and/ or microcontrollers from any desired family or manufacturer. The programmable circuitry 512 may be implemented by one or more semiconductor based (e.g., silicon based) devices. In this example, the programmable circuitry 512 implements the signal processing circuitry 102.

The programmable circuitry 512 of the illustrated example includes a local memory 513 (e.g., a cache, registers, etc.). The programmable circuitry 512 of the illustrated example is in communication with main memory 514, 516, which includes a volatile memory 514 and a non-volatile memory 516, by a bus 518. The volatile memory 514 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 516 may be implemented by flash memory and/or any other desired type of memory device. Access to the main memory 514, 516 of the illustrated example is controlled by a memory controller 517. In some examples, the memory controller 517 may be implemented by one or more integrated circuits, logic circuits, microcontrollers from any desired family or manufacturer, or any other type of circuitry to manage the flow of data going to and from the main memory 514, 516.

The programmable circuitry platform 500 of the illustrated example also includes interface circuitry 520. The interface circuitry 520 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 522 are connected to the interface circuitry 520. The input device(s) 522 permit(s) a user (e.g., a human user, a machine user, etc.) to enter data and/or commands into the programmable circuitry 512. The input device(s) 522 can be implemented by, for example, an audio sensor, a microphone, a keyboard, a button, a mouse, a touchscreen, a trackpad, a trackball, an isopoint device, and/or a voice recognition system.

One or more output devices 524 are also connected to the interface circuitry 520 of the illustrated example. The output device(s) 524 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, and/or speaker. The interface circuitry 520 of the illustrated example, thus, typically includes a graphics driver card, a graphics driver chip, and/or graphics processor circuitry such as a GPU.

The interface circuitry 520 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 526. The communication can be by, for example, an Ethernet connection, a digital subscriber line (DSL) connection, a telephone line connection, a coaxial cable system, a satellite system, a beyond-line-of-sight wireless system, a line-of-sight wireless system, a cellular telephone system, an optical connection, etc.

The programmable circuitry platform 500 of the illustrated example also includes one or more mass storage discs or devices 528 to store firmware, software, and/or data.

Examples of such mass storage discs or devices 528 include magnetic storage devices (e.g., floppy disk, drives, HDDs, etc.), optical storage devices (e.g., Blu-ray disks, CDs, DVDs, etc.), RAID systems, and/or solid-state storage discs or devices such as flash memory devices and/or SSDs.

The machine readable instructions 532 may be stored in the mass storage device 528, in the volatile memory 514, in the non-volatile memory 516, and/or on at least one non-transitory computer readable storage medium such as a CD or DVD which may be removable.

From the foregoing, it will be appreciated that example systems, apparatus, articles of manufacture, and methods have been disclosed that implement a single signal path to couple a signal output by one amplifier of a transmitter to a different amplifier of the transmitter. The single signal path disclosed herein provides both a signal to be amplified and a bias voltage to bias the proceeding amplifier. Disclosed systems, apparatus, articles of manufacture, and methods improve the efficiency of using a computing device by eliminating and/or reducing a delay in outputting a signal typically caused by memory effect. Disclosed systems, apparatus, articles of manufacture, and methods are accordingly directed to one or more improvement(s) in the operation of a machine such as a computer or other electronic and/or mechanical device.

The following claims are hereby incorporated into this Detailed Description by this reference. Although certain example systems, apparatus, articles of manufacture, and methods have been disclosed herein, the scope of coverage of this patent is not limited thereto. On the contrary, this patent covers all systems, apparatus, articles of manufacture, and methods fairly falling within the scope of the claims of this patent.

What is claimed is:

1. A system comprising:
    a first amplifier including a signal input, a feedback input, and a differential output that includes a first output and a second output;
    a first resistor including a first resistor terminal and a second resistor terminal, wherein the first resistor terminal is coupled to the first output;
    a second resistor including a third resistor terminal and a fourth resistor terminal, wherein the third resistor terminal is coupled to the second resistor terminal at an output common mode node and the fourth resistor terminal coupled to the second output; and
    a second amplifier including a first input and a third output, wherein the first input is coupled to the second resistor terminal and third resistor terminal, and the third output is coupled to the feedback input of the first amplifier.

2. The system of claim 1, wherein the feedback input is coupled to receive a correction signal from the third output, wherein the correction signal is to cause the first amplifier to adjust a common mode voltage at the output common mode node.

3. The system of claim 1, wherein the second amplifier includes a second input and the system further comprises envelope detection circuitry to provide a dynamic bias voltage to the second input.

4. The system of claim 1, further comprising envelope detection circuitry including:
    a full-wave rectifier base level detector including a second input, a third input, and a fourth output, wherein the second input and third input are coupled to receive differential first amplified signals; and a filter including a fourth input and a dynamic bias output, wherein the fourth input is coupled to the fourth output of the full-wave rectifier base level detector and the dynamic bias output is coupled to fifth input of the second amplifier.

5. The system of claim 1, further comprising a third amplifier including a second input and a third input, wherein the second input is coupled to the first output and the third input is coupled to the second output.

6. The system of claim 1, further comprising:

envelope detection circuitry including a second input, a third input, and a dynamic bias output, wherein the dynamic bias output is coupled to a fourth input of the second amplifier; and a third amplifier including a fourth output and a fifth output, wherein the fourth output is coupled to the second input and coupled to the signal input, the fifth output is coupled to the third input and coupled to the signal input.

7. The system of claim 1, further comprising a third amplifier including a fourth output and a fifth output, wherein the fourth output is coupled to the signal input of the first amplifier and the fifth output is coupled to the signal input.

8. The system of claim 1, further comprising:

a third amplifier;

a first capacitor including a first capacitor terminal and a second capacitor terminal, wherein the first capacitor terminal is coupled to a fourth output of the third amplifier and the second capacitor terminal coupled to the signal input of the first amplifier; and a second capacitor including a third capacitor terminal and a fourth capacitor terminal, wherein the third capacitor terminal is coupled to a fifth output of the third amplifier and the fourth capacitor terminal coupled to the signal input.

9. The system of claim 1, wherein the first amplifier is a preamplifier.

10. The system of claim 1, wherein the second amplifier is a common mode feedback (CMFB) amplifier.

11. A circuit comprising:

a first transistor including a first gate terminal, a first drain terminal, and a first source terminal;

a first resistor including a first resistor terminal and a second resistor terminal, wherein the first resistor terminal is coupled to the first drain terminal;

a second transistor including a second gate terminal, a second drain terminal, and a second source terminal;

a second resistor including a third resistor terminal and a fourth resistor terminal, wherein the third resistor terminal is coupled to the second drain terminal and the fourth resistor terminal is coupled to the second resistor terminal at an output common mode node;

a third transistor including a third gate terminal, a third drain terminal, and a third source terminal, wherein the third drain terminal is coupled to the first resistor terminal and to the first drain terminal; and a fourth transistor including a fourth gate terminal, a fourth drain terminal, and a fourth source terminal, wherein the fourth drain terminal is coupled to the third resistor terminal and to the second drain terminal, and the fourth gate terminal is coupled to the third gate terminal.

12. The circuit of claim 11, further comprising:

a first capacitor coupled to the first gate terminal; and a second capacitor coupled to the second gate terminal.

13. The circuit of claim 11, further comprising:

a third resistor coupled the first gate terminal; and a fourth resistor coupled the second gate terminal.

14. The circuit of claim 11, further comprising:

a current source;

a fifth transistor including a fifth gate terminal, a fifth drain terminal, and a fifth source terminal, wherein the fifth drain terminal is coupled to the current source and to the fifth gate terminal; and a third resistor including a fifth resistor terminal and a sixth resistor terminal, wherein the fifth resistor terminal is coupled to the fifth gate terminal and the sixth resistor terminal coupled to the first gate terminal.

15. The circuit of claim 11, wherein the first transistor and the second transistor are n-channel metal-oxide semiconductor (NMOS) transistors.

16. The circuit of claim 11, wherein the third transistor and the fourth transistor are p-channel metal-oxide semiconductor (PMOS) transistors.

17. The circuit of claim 11, wherein the third gate terminal and the fourth gate terminal are coupled to receive a correction signal, wherein the correction signal is to cause the first transistor and the second transistor to adjust a common mode voltage at the output common mode node.

18. The circuit of claim 17, wherein the first resistor and the second resistor are averaging resistors, wherein the averaging resistors are to generate the common mode voltage of a first voltage at the first drain terminal and a second voltage at the second drain terminal.

19. An apparatus comprising:

signal processing circuitry including a first data output and a second data output;

pre-amplifier circuitry including:

a first amplifier including a first input, a second input, a first output, and a second output, wherein the first input is coupled to receive the first data output and the second input is coupled to receive the second data output;

a second amplifier including a third input, a fourth input, a feedback input, a differential output that includes a third output and a fourth output, wherein the third input (234a) is coupled to the first output and the fourth input is coupled to the second output;

a third amplifier including a fifth input, a sixth input, and a feedback output, the feedback output coupled to the feedback input; and averaging resistors coupled to the third and fourth outputs and coupled to the fifth input;

a power amplifier including a seventh input and an eighth input, the seventh input coupled to the third output and the eighth input coupled to the fourth output; and an antenna coupled to an output of the power amplifier.

20. The apparatus of claim 19, further including a mixer to:

receive the first data output and the second data output;

generate a first modulated signal based on the first data output and a second modulated signal based on the second data output;

output the first modulated signal to the first input; and output the second modulated signal to the second input.

* * * * *